United States Patent
Trescases et al.

(10) Patent No.: US 10,263,615 B2
(45) Date of Patent: Apr. 16, 2019

(54) CIRCUIT AND METHOD FOR DRIVING A DEVICE THROUGH DRIVE CYCLES

(71) Applicant: Texas Instruments Incorporated, Dallas, TX (US)

(72) Inventors: Olivier Trescases, Toronto (CA); Johan Tjeerd Strydom, Santa Clara, CA (US); Rajarshi Mukhopadhyay, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/245,857

(22) Filed: Aug. 24, 2016

(65) Prior Publication Data
US 2018/0062643 A1 Mar. 1, 2018

(51) Int. Cl.
| H03K 3/00 | (2006.01) |
| H03K 17/687 | (2006.01) |
| H03K 5/08 | (2006.01) |
| H01L 29/16 | (2006.01) |
| H03K 17/042 | (2006.01) |
| H03K 17/082 | (2006.01) |

(52) U.S. Cl.
CPC ....... *H03K 17/687* (2013.01); *H01L 29/1608* (2013.01); *H03K 5/08* (2013.01); *H03K 17/04206* (2013.01); *H03K 17/0822* (2013.01)

(58) Field of Classification Search
CPC ..... H03K 17/687; H03K 5/08; H01L 29/1608
See application file for complete search history.

(56) References Cited

U.S. PATENT DOCUMENTS

| 3,584,308 | A | * | 6/1971 | Neu | G11C 19/28 377/67 |
| 3,761,617 | A | * | 9/1973 | Tsuchiya | G09G 3/30 315/169.1 |
| 5,773,999 | A | * | 6/1998 | Park | G11C 7/1051 326/27 |
| 6,097,219 | A | * | 8/2000 | Urata | H03K 19/0005 326/47 |
| 6,518,800 | B2 | | 2/2003 | Martin et al. | |
| 6,642,742 | B1 | | 11/2003 | Loyer | |
| 7,170,324 | B2 | * | 1/2007 | Huber | H03K 17/163 326/82 |
| 7,863,934 | B2 | | 1/2011 | Lin | |
| 8,193,960 | B2 | | 6/2012 | Kuramochi | |
| 8,258,820 | B2 | * | 9/2012 | Strzalkowski | H03K 17/163 327/108 |

(Continued)

OTHER PUBLICATIONS

Office Action (11 pages) dated Oct. 5, 2017 for U.S. Appl. No. 15/463,578.

(Continued)

*Primary Examiner* — Kenneth B Wells
(74) *Attorney, Agent, or Firm* — Michelle F. Murray; Charles A. Brill; Frank D. Cimino

(57) ABSTRACT

Methods and circuitry for driving a device through drive cycles wherein each drive cycle has a plurality of drive stages are disclosed. An example of the circuitry includes an output for coupling the circuitry to the device and a plurality of drive slices coupled in parallel to the output. Control circuitry selectively activates individual drive slices in the plurality of drive slices during each stage of a drive cycle.

20 Claims, 11 Drawing Sheets

(56) References Cited

U.S. PATENT DOCUMENTS

| | | | |
|---|---|---|---|
| 8,487,604 B2 | 7/2013 | Ikriannikov et al. | |
| 8,498,089 B2 | 7/2013 | Lorentz | |
| 8,643,404 B1 * | 2/2014 | Chaung | H03K 17/145 326/87 |
| 8,710,810 B1 | 4/2014 | McJimsey et al. | |
| 2006/0152205 A1 | 7/2006 | Tang et al. | |
| 2008/0252240 A1 | 10/2008 | Sugie | |
| 2009/0160412 A1 | 6/2009 | Latham et al. | |
| 2009/0296441 A1 | 12/2009 | Klemt | |
| 2012/0307526 A1 | 12/2012 | Senanayake | |
| 2013/0027009 A1 | 1/2013 | Tang et al. | |
| 2015/0015219 A1 | 1/2015 | Ishino et al. | |
| 2015/0077081 A1 | 3/2015 | Ejury et al. | |
| 2015/0236586 A1 | 8/2015 | Babazadeh et al. | |
| 2016/0064935 A1 | 3/2016 | Gao | |
| 2016/0112042 A1 | 4/2016 | Hanson et al. | |
| 2016/0233766 A1 | 11/2016 | Todorov et al. | |
| 2017/0098998 A1 | 4/2017 | Zhou et al. | |
| 2017/0126113 A1 | 5/2017 | Ejury et al. | |
| 2017/0288532 A1 | 10/2017 | Zhou et al. | |

OTHER PUBLICATIONS

Office Action (8 pages) dated Oct. 13, 2017 for U.S. Appl. No. 15/245,882.

* cited by examiner

CIRCUIT AND METHOD FOR DRIVING A DEVICE THROUGH DRIVE CYCLES

BACKGROUND

Silicon carbide (SiC) based power electronic devices have significant advantages over silicon (Si) based devices in some respects. Silicon carbide devices are able to operate at much higher frequencies and temperatures than silicon devices. In addition, silicon carbide devices convert electric power at higher efficiency with lower losses than silicon devices. Furthermore, silicon carbide devices are capable of managing the same level of power as silicon devices while requiring only half the size of silicon devices, which enables increases in power density on a circuit board.

DC-to-DC power converters have circuitry or gate controllers that drive gates of transistors, such as metal oxide silicon field-effect transistors (MOSFETs). The transistors in high voltage and/or high power converters pass high current or have to regulate high voltages, which has proven to have difficulties.

SUMMARY

Methods and circuitry for driving a device through drive cycles wherein each drive cycle has a plurality of drive stages are disclosed. An example of the circuitry includes an output for coupling the circuitry to the device and a plurality of drive slices coupled in parallel to the output. Control circuitry selectively activates individual drive slices in the plurality of drive slices during each stage of a drive cycle.

DETAILED DESCRIPTION

Silicon carbide (SiC) based power electronic devices have significant advantages over silicon (Si) based devices in some respects. Silicon carbide devices operate at much higher frequencies and temperatures than silicon devices and convert electric power at higher efficiency with lower losses than silicon devices. In addition, silicon carbide devices are capable of managing the same level of power as silicon devices while requiring only half the size of silicon devices, which enables increases in density on a circuit board. Some conventional devices that require high bandwidth analog drivers are not suitable for fast silicon carbide metal oxide semiconductor field-effect transistors (MOSFETs) because they cannot achieve the required control bandwidth under high current conditions.

Figure 1:
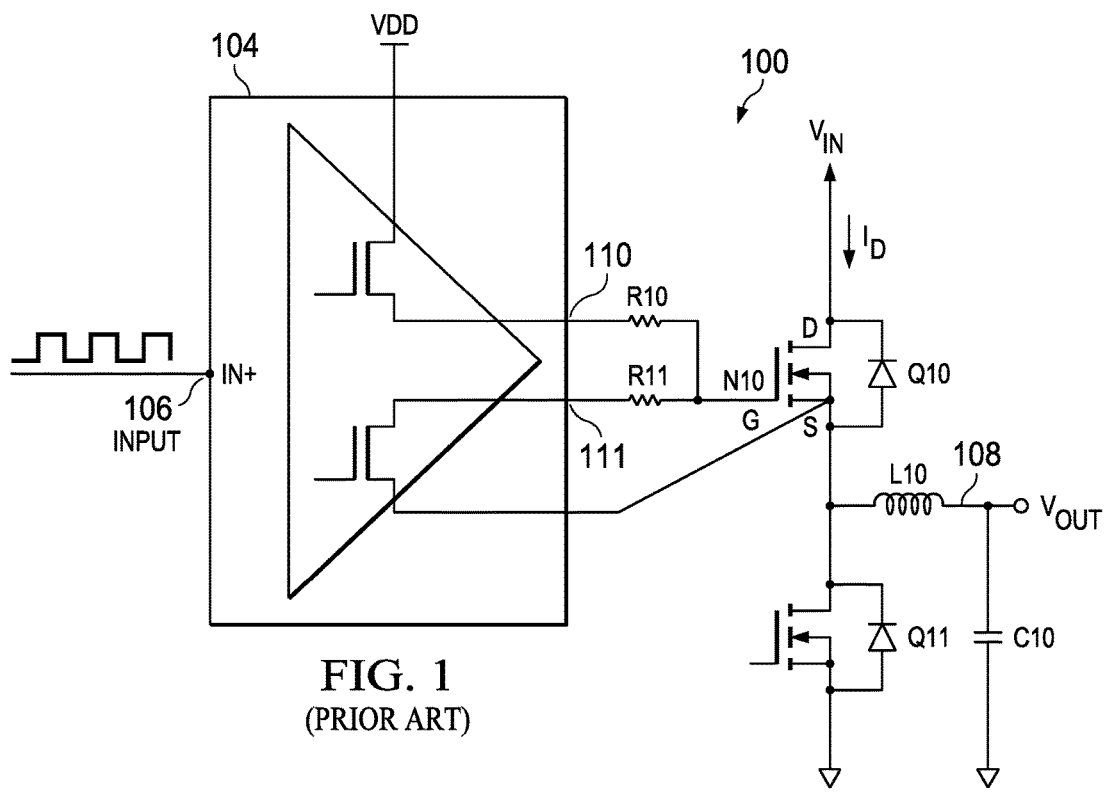
FIG. 1 is a schematic diagram of a conventional converter.

FIG. 1 is a schematic diagram of an exemplary conventional converter 100. The converter 100 includes circuitry 104 that drives a switch, which in the example of FIG. 1 is a SiC MOSFET Q10. In other examples, the switch may be a device that has properties similar to the properties of a SiC MOSFET or any gate semiconductor switching device. The circuitry 104 is fabricated in an integrated circuit having six pins. An input 106 receives an input signal, which in the example of FIG. 1 is a pulse width modulated (PWM) signal. The converter 100 has an output 108, wherein an output voltage $V_{OUT}$ is present during operation of the converter 100. The circuitry 104 has a pull-up output 110 and a pull-down output 111 that are coupled to a node N10 through two resistors, R10 and R11. The gate of transistor Q10 is coupled to node N10.

The drain of transistor Q10 is coupled to an input voltage $V_{IN}$ and the source of transistor Q10 is coupled to a negative supply voltage by way of a transistor Q11, which is a similar device to transistor Q10 that has a driver (not shown) that is similar to the circuitry 104. The source of transistor Q10 is coupled to the converter output 108 by way of an inductor L10. The converter output 108 is coupled to ground by way of a capacitor C10. Transistor Q10 conducts current through inductor L10 in response to the voltage at node N10. More specifically, the voltage at node N10 determines the drain/source resistance of transistor Q10, which is inversely proportional to the voltage at the gate of transistor Q10. The converter 100 changes the voltage at the gate of transistor Q10 causing transistor Q10 to turn off and on, which charges and discharges capacitor C10.

The values of resistors R10 and R11 are fixed and are selected as a tradeoff between efficiency and reducing electromagnetic interference. If the resistance values of resistors R10 and R11 are selected so that transistor Q10 turns on and off very fast, efficiency is improved. However, the fast transitions in transistor Q10 cause fast changes in the current flow through transistor Q10, which generates high frequency components at the output 108 and other portions of the converter 100. These high frequency components propagate through the converter 100 and components connected to the output 108 and cause problems with operation of the converter 100 and the connected components.

Figure 2A:
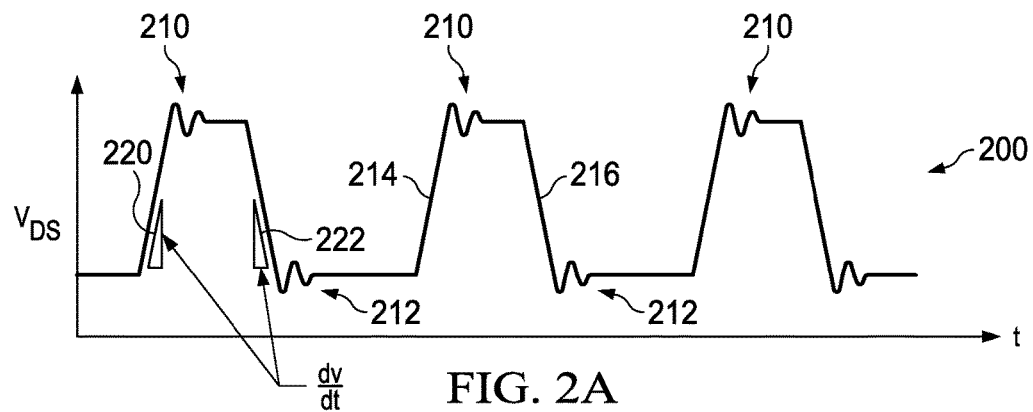
FIG. 2A is a graph showing an example of drain voltage of the converter of FIG. 1 as a function of time.
Figure 2B:
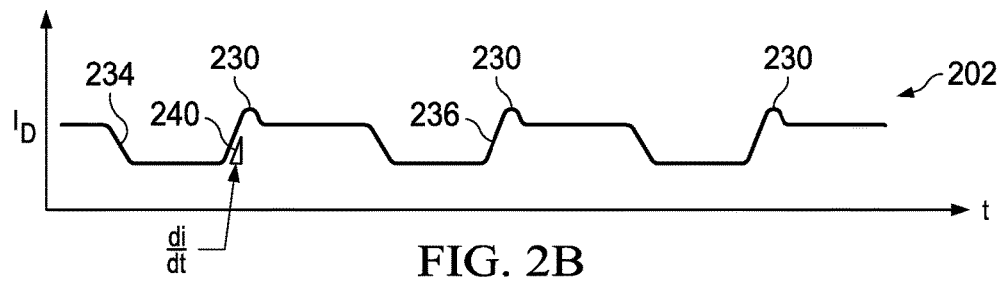
FIG. 2B is a graph showing an example of current flow through the transistor in the converter of FIG. 1 as a function of time.

The converter 100 and similar converters have problems with the overshoot of the drain/source voltage $V_{DS}$ across transistor Q10, the rate of change of the drain/source voltage $V_{DS}$, and the rate of change of the drain current $I_D$. FIG. 2A is a graph 200 showing an example of the drain/source voltage $V_{DS}$ across transistor Q10 of FIG. 1 as a function of time. FIG. 2B is a graph 202 showing an example of the drain current $I_D$ flowing through transistor Q10 in the converter 100 of FIG. 1 as a function of time. The graph 200 shows voltage overshoots 210 and 212 in the waveform of the drain/source voltage $V_{DS}$. The voltage overshoots 210 are overshoots on the rising edges 214 of the drain/source voltage $V_{DS}$ and the voltage overshoots 212 are on the falling edges 216 of the drain/source voltage $V_{DS}$. The voltage overshoots 210 and 212 are the result of inherent inductance and capacitance in the converter 100 coupled with high frequency shifting of the drain/source voltage $V_{DS}$ and cause inaccuracies in the converter output voltage $V_{OUT}$ in addition to the other above-described problems.

The rate of rise and fall of the rising edge 214 and the falling edge 216 is referred to as the slope or dv/dt of the drain/source voltage $V_{DS}$. The rate of rise of the rising edge 214 is referred to as the rising slope 220 and the rate of fall of the falling edge 216 is referred to as the falling slope 222. The slopes are proportional to the high frequency components in the waveform of the drain/source voltage $V_{DS}$. The steeper the slopes 220 and 222, the higher the frequency components constituting the waveform. These high frequency components can propagate through the converter 100 and devices coupled thereto resulting in electromagnetic interference (EMI). However, the converter 100 operates more efficiently with steep slopes 220 and 222, so there is typically a range of slope values where EMI and efficiency are within predetermined parameters. Neither EMI nor efficiency are typically maximized by the slope values.

The graph 202 of FIG. 2B shows an example of the drain current $I_D$ that flows between the drain and the source of transistor Q10 as a function of time. The waveform of the drain current $I_D$ has current overshoots 230 occurring at the same or the approximate same time as changes in the drain/source voltage $V_{DS}$ of FIG. 2A. The current overshoots 230 cause similar problems as the voltage overshoots 210 and 212 in the waveform of the drain/source voltage $V_{DS}$. The waveform of the drain current $I_D$ has a falling edge 234 and a rising edge 236. The rate of the change of the drain current $I_D$ as a function of time is referred to as di/dt and is measured as the slope 240 of the rising edge 236. As with the slope of the drain/source voltage $V_{DS}$, the slope 240 of the drain current $I_D$ should be maintained within predetermined parameters to maximize efficiency and reduce EMI. As with the drain/source voltage $V_{DS}$, neither EMI nor efficiency are maximized when the current $I_D$ is maintained within the parameters. The falling edge 234 of the drain current $I_D$ may have overshoots and all the overshoots may be controlled by the methods and circuitry described herein.

Conventional gate drivers have current sensing components, such as shunt resistors, Desat circuitry, or current mirrors to detect or measure the drain current $I_D$. The current sensing provides information as to the drain current $I_D$, which can indicate a short circuit condition and/or an over current condition. For example, if the converter output 108 is coupled to ground or a very low resistance, excessive current will flow through the converter 100, which could damage the converter 100. The current sensing components identify the current overshoots 230 and short circuit conditions and attempt to rectify the current situation before damage occurs. Shunt resistors are current sensing components, but they are expensive and require large amounts of area. Low resistance shunt resistors typically have an unacceptable inductance to resistance ratio, which makes sensing di/dt difficult. The addition of current mirrors or other devices usually increases the number of pins in an integrated circuit, which is costly. Desat circuitry requires external circuitry including a high voltage diode, which is costly.

The gate drivers and methods of driving gates described herein overcome the above-described problems associated with shunt resistors and other sensing components. The circuits and method described herein detect and/or measure the voltage on a transistor node (drain or source) under both high voltage and low voltage conditions. The measurements provide information related to the voltage on the node of the transistor for dv/dt and di/dt control and indications as to current flow through the transistor. The circuits and methods detect over current, such as short circuit conditions, without the need of shunt resistors, desat circuitry, or current mirrors described above.

In summary, the circuits and methods described herein sense current with a resistor divider and a capacitance divider. The resistor divider senses the on-state voltage across a transistor during an overload condition. During the overload condition, the current increases, which increases the on-state voltage. Control devices can protect the circuitry when the on-state voltage is greater than a predetermined value. The capacitive divider senses the drain voltage of the transistor as the transistor is turning on. The drain voltage should drop quickly as the transistor turns on. If not, there is likely a short within the converter or some other problem. The converter can be immediately turned off without waiting for a blanking time as required in desat circuits. One advantage to the circuits and methods described herein is that the circuits measure or sense high voltage, but the components within the circuits do not have to be rated to the high voltages because they process lower voltages that are proportional to the high voltages.

Figure 3:
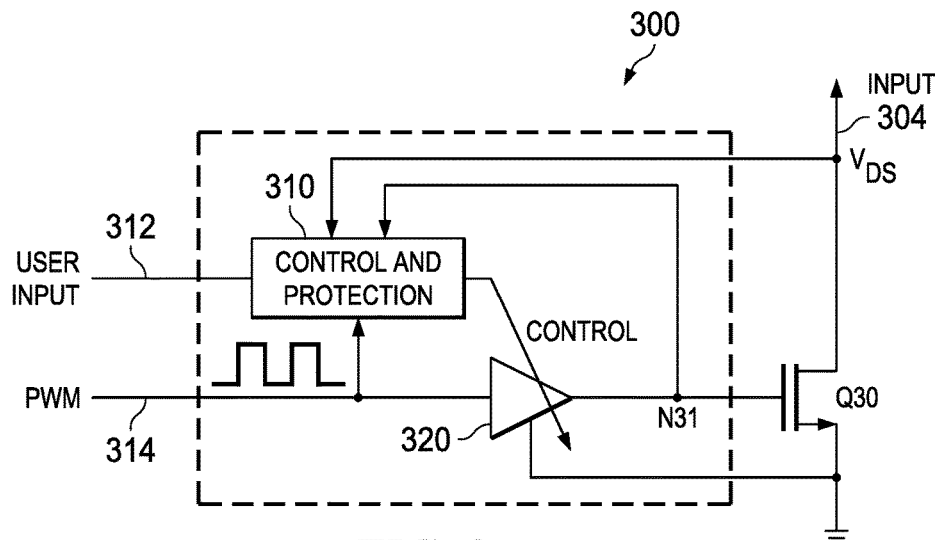
FIG. 3 is a schematic diagram of a gate driver coupled to a transistor, wherein the gate driver overcomes the problems with conventional gate drivers.

FIG. 3 is a schematic diagram of a gate driver 300 coupled to a transistor Q30, wherein the gate driver 300 overcomes the above-described problems with conventional gate drivers. The gate driver 300 may be part of larger circuitry, such as a voltage converter (not shown). In the examples described herein, transistor Q30 is a silicon carbide (SiC) MOSFET, but it could be other devices as known in the art, such as an insulated gate bipolar transistor (IGBT). In other examples, transistor Q30 could be any device that has switching performance that can be influenced by the voltage and/or current at its control terminal, such as a gate or base of a transistor. The term "gate" and "base" are used interchangeably herein to refer to the gate or base of a transistor depending on the transistor type. The gate driver 300 has a high voltage input 304 that is coupled to the drain of transistor Q30. The voltage at the input 304 is the drain/source voltage $V_{DS}$ of transistor Q30, which is also referred to as the drain voltage given that the source of transistor Q30 is coupled to ground. In some examples, the source of transistor Q30 is coupled to other devices and not to ground, so the gate controller operates from the potential of the source of transistor Q30 to obtain an accurate drain/source voltage $V_{DS}$. In embodiments where transistor Q30 is a P-channel device, the nodes are switched so that the source is coupled to the high voltage input. The examples described herein are related to N-channel devices, but they could be also implemented with P-channel devices by those skilled in the art.

The input 304 is coupled to control and protection circuitry 310, which is described in detail below. A user input 312 is coupled to the circuitry 310 and sets operating characteristics of the circuitry 310. The user may be a processor or control module coupled to the gate driver 300. A signal input 314 receives a signal for driving the gate of transistor Q30. In the example of FIG. 3, the signal received at the input 314 is a pulse width modulated (PWM) signal. A variable driver 320 drives the gate of transistor Q30. The driver 320 is coupled to ground; however, in other examples where the transistor Q30 has a Kelvin sensor pin, the driver 320 may be referenced to the Kelvin source pin. The output of the driver 320, which is the gate voltage of transistor Q30, is coupled as an input to the circuitry 310 at a node N31. In some examples, the driver 320 and the circuitry 310 are fabricated as a single component.

The circuitry 310 receives user input by way of the input 312. The user input may be parameters such as high and low values for the dv/dt and/or di/dt as described above. The circuitry 310 monitors the drain/source voltage $V_{DS}$ of transistor Q30 by way of the input 304 and it also monitors the gate voltage $V_{GS}$ of transistor Q30. In some examples, the gate voltage is monitored at node N31 at the output of the driver 320 because the voltage at the output of the driver 320 may vary from the voltage at the gate of transistor Q30 due to interconnection impedance between the devices. The circuitry 310 controls the drive into the gate of transistor Q30 by way of the driver 320 in response to the above-described inputs.

Figure 4:
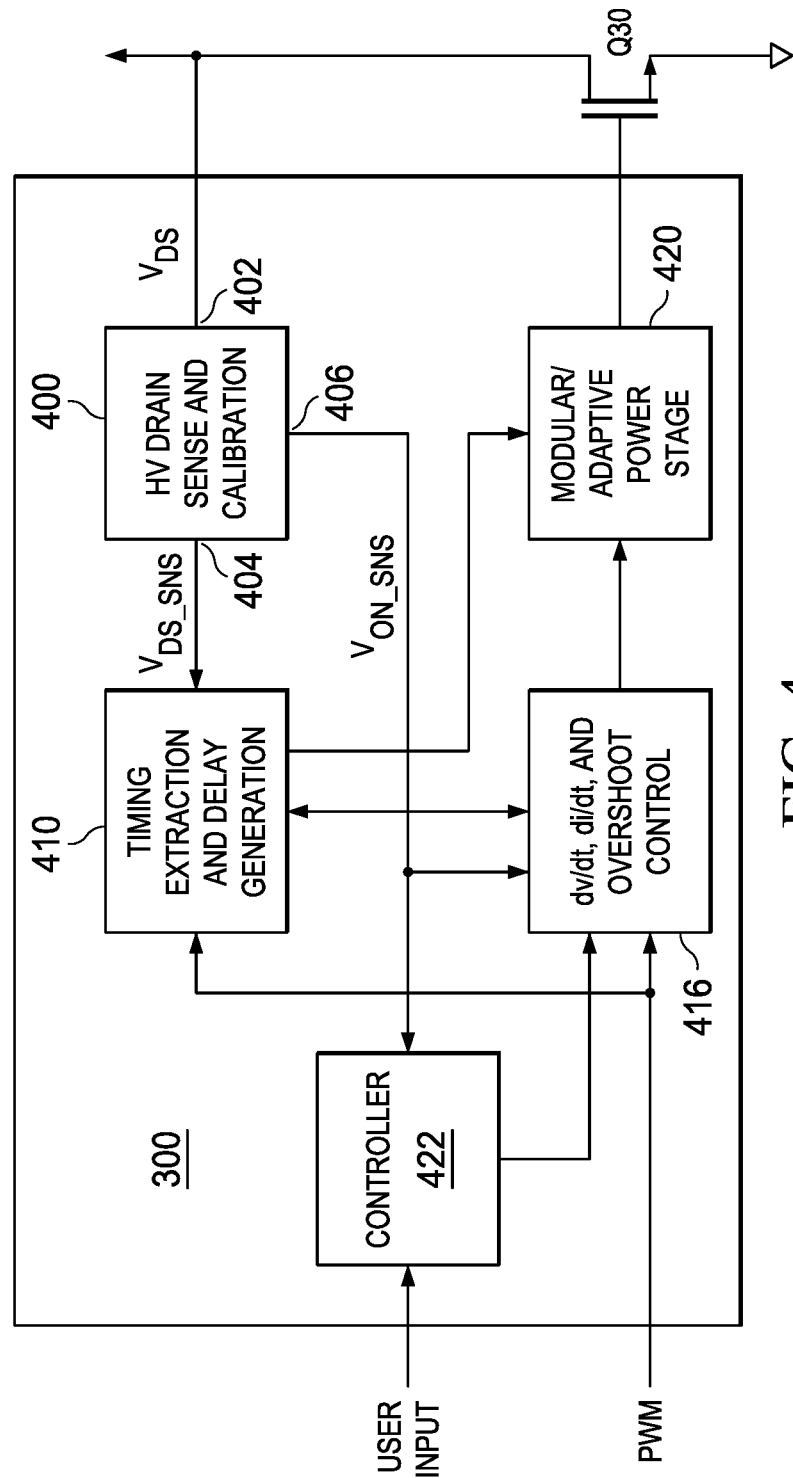
FIG. 4 is a detailed block diagram of an example gate driver of FIG. 3.

FIG. 4 is a block diagram of an example of the gate controller 300 of FIG. 3. The gate controller 300 includes a high voltage drain sense and calibration circuit 400 that is referred to herein as the drain sense circuit 400. The drain sense circuit 400 has an input 402 coupled to the drain of transistor Q30. Because the source of transistor Q30 is coupled to ground or another node, the voltage at the input 402 is the drain/source voltage $V_{DS}$ of the transistor Q30. The drain sense circuit 400 has an output 404 and an output 406. The voltage at the output 404 is a sensed $V_{DS}$ voltage $V_{DS\_SNS}$ and is proportional to the changes in the drain voltage of transistor Q30 as described in detail below. The output 406 is a voltage $V_{ON\_SNS}$, which is proportional to the drain voltage $V_{DS}$ of transistor Q30 during periods when transistor Q30 is on. The drain voltage $V_{DS}$ is reduced to a voltage that may be processed by other components in the gate driver 300 as described below.

In the example of FIG. 4, the output 404 is coupled to a timing extraction and delay generation circuit 410. The circuit 410 processes the voltage $V_{DS\_SNS}$ to determine the timing of the signal driving the gate of transistor Q30 in addition to other parameters described herein. The circuit 410 is coupled to a dv/dt, di/dt, and overshoot control circuit 416 that analyzes the slope and/or timing of the di/dt and/or dv/dt intervals of current and voltage and the overshoots in the transistor Q30. Additionally, the circuit 410 drives a modular/adaptive power stage 420 to drive the gate of transistor Q30 in response to the analysis. The power stage 420 drives the gate of transistor Q30 in a manner to assure that dv/dt, di/dt, and the overshoots are within predetermined specifications. The output 406 is coupled to a controller 422 that also receives a user input and provides data to the circuit 416 in response to the voltage $V_{ON\_SNS}$ and the user input. In some examples, the output 406 can be fed back to the circuit 416 to change the operating point of the power stage 420. For example, if during an initial overload current condition, the gate voltage of transistor Q30 is increased to reduce conduction losses, and if the overload continues to grow, then the gate voltage is reduced to initiate over current protection turn-off.

Figure 5:
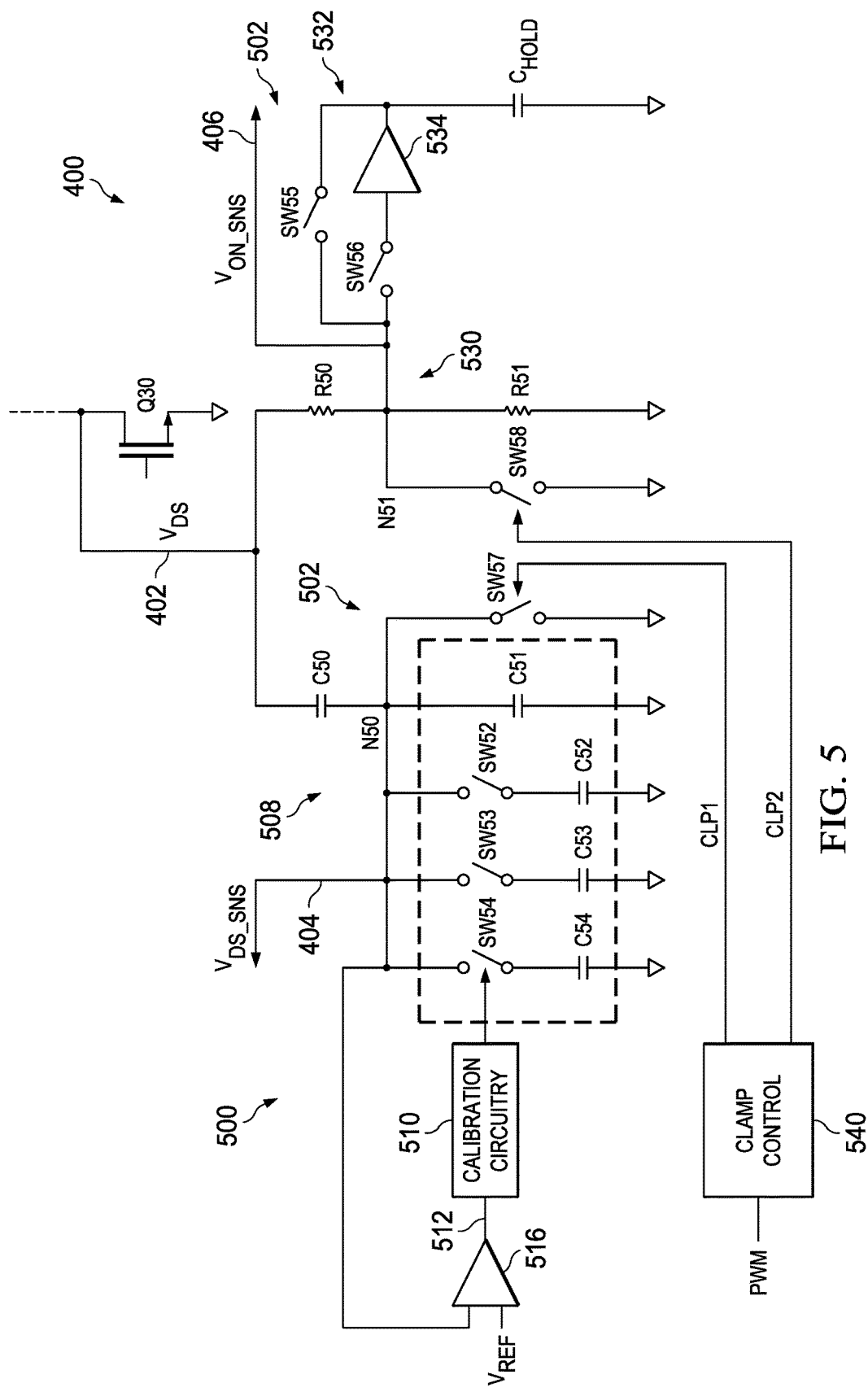
FIG. 5 is a schematic diagram of an example gate driver of FIG. 4

FIG. 5 is a schematic illustration of an example of the drain sense circuit 400 of FIG. 4. The circuit 400 has the input 402 that receives the drain or drain/source voltage $V_{DS}$ from transistor Q30 and the outputs 404 and 406 that output the voltages $V_{DS\_SNS}$ and $V_{ON\_SNS}$. The circuit 400 includes a voltage sensing portion 500 and a current sensing portion 502, both of which are coupled to the input 402. The current sensing portion 502 senses voltage for other circuitry to determine the current as described below. The voltage sensing portion 500 includes a capacitive voltage divider 502, which may be a high ratio capacitive voltage divider. The divider 502 includes a capacitor C50, which in some examples is a high voltage capacitor that is rated to a voltage that is present at the drain of transistor Q30. The capacitor C50 is coupled in series with a capacitor array 508 at a node N50. The capacitor array 508 includes a plurality of capacitors that are selectively coupled in parallel to node N50. The capacitors in the capacitor array 508 are referred to individually as capacitors C51, C52, C53, and C54. The capacitors are coupled in parallel to node N50 by a plurality of switches. A switch SW52 couples capacitor C52, a switch SW53 couples capacitor C53, and a switch SW54 couples a capacitor C54. The states of the switches SW52-SW54 are controlled by calibration circuitry 510. The number of capacitors in the capacitor array 508 is a design choice and may be greater than or less than three capacitors as shown in FIG. 5. In some examples, the capacitor array 508 has capacitor C50 coupled in series with a single capacitor instead of the capacitors and switches in the capacitor array 508.

The calibration circuitry 510 has an input 512 coupled to the output of a comparator 516. A first input of the comparator 516 is coupled to a reference voltage $V_{REF}$, which may be set by a user and is set to 5V in the examples provided herein. A second input of the comparator 516 is coupled to the output of the capacitor array 508 at node N50 and is the voltage $V_{DS\_SNS}$. The comparator 516 compares the voltage $V_{DS\_SNS}$ to the reference voltage $V_{REF}$ and outputs a signal to the input 512 of the calibration circuitry 510 in response to the comparison. The calibration circuitry 510 iteratively adjusts the states of the switches SW52-SW54 so that the reference voltage $V_{REF}$ is equal to the voltage $V_{DS\_SNS}$ or within a predetermined value of the voltage $V_{DS\_SNS}$. When the switches SW52-SW54 are set so that the voltage $V_{DS\_SNS}$ is equal to the reference voltage $V_{REF}$, the value of the drain/source voltage $V_{DS}$ is readily determined based on the voltage division between the capacitor C50 and the capacitance of the capacitor array 508.

The current sensing portion 502 includes a resistive divider 530 that includes two resistors R50 and R51 coupled at a node N51. The resistive divider 530 senses the DC current flow through transistor Q30, which may be used to determine a short circuit or over current situations. The resistive divider 530 is subject to high voltage with a very steep slope when transistor Q30 transitions between off and on states. During the periods when the input 402 is subject to high voltages, the switch SW58 is closed to protect components coupled to the output 406 from the high voltages. In some examples, resistor R50 and/or resistor R51 have very low capacitance, such as less than 50 fF. The low capacitance assures that resistors R50 and R51 have fast settling times, which is required to improve the bandwidth of the drain sense circuit 400. When switch SW58 opens during the on-state of transistor Q30, which is when the drain of transistor Q30 is a low voltage, the voltage across resistor R51 has to increase from zero to the given divider ratio voltage fraction of the voltage at the input 402. Any parallel/distributed parasitic capacitance in resistor R51 and/or resistor R50 will delay the voltage increase. To protect coupled circuit components such as transistor Q30, the capacitance is minimized, so as to enable the maximize speed for the voltage rise at the output 406. In some examples, the RC time constant in resistors R50 and R51 is in the range of one microsecond or less. One method of improving the time constant is by shielding resistor R50 from ground, such as shielding it with a shield coupled to the output 406. Such an embodiment addresses the parasitic capacitance to the output and improves the settling time.

A sample and hold circuit 532 is coupled to the resistive divider 530 and samples and holds the voltage at a node N51 coupled between resistors R50 and R51. The circuit 532 includes a holding capacitor $C_{HOLD}$ that is coupled to node N51 by way of switches SW55 and SW56. A driver 534 is coupled between the switch SW56 and capacitor $C_{HOLD}$. When the switches SW55 and SW56 are closed, the circuit 532 samples and holds the voltage at node N51, which is the voltage $V_{ON\_SNS}$.

Clamp control circuitry 540 receives PWM signals for driving the gate of transistor Q30 and resets the voltage sensing portion 500 and the current sensing portion 502 of the circuitry 400 in response to the PWM signals. The circuitry 540 has two outputs CLP1 and CLP2 that clamp or short portions of the voltage sensing portion 500 and the current sensing portion 502, respectively. The output CLP1 controls switch SW57 and the output CLP2 controls switch SW58. Switch SW57 couples node N50 to ground when switch SW57 closes and switch SW58 couples node N51 to ground when switch SW58 closes. The timing of CLP1 and CLP2 is described further below.

Figure 6:
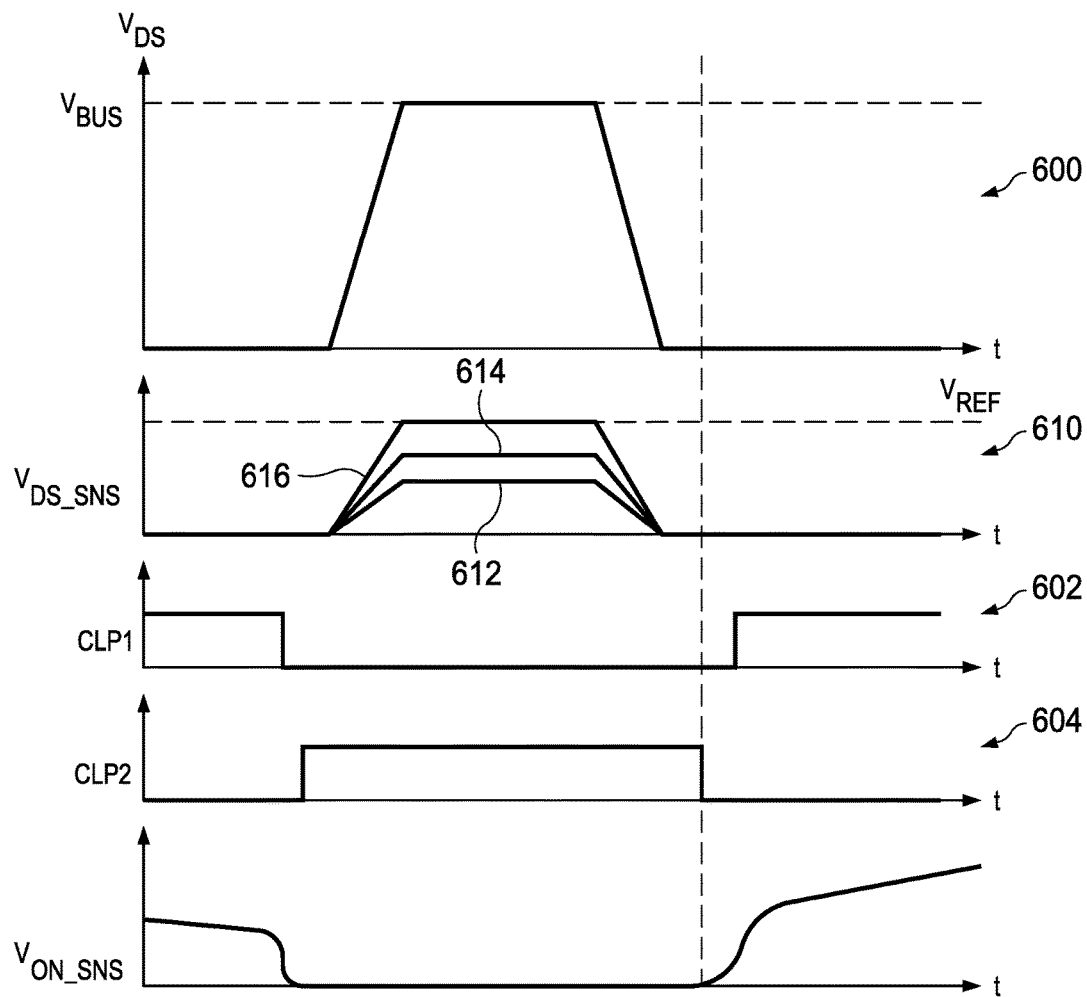
FIG. 6 is a plurality of timing diagrams showing different voltage functions in the circuit of FIG. 5.

FIG. 6 is a plurality of timing diagrams showing examples of different voltage functions in the circuit 400 of FIG. 5. A graph 600 shows an example of the drain/source voltage $V_{DS}$, which is the drain/source voltage across transistor Q30, as a function of time. The drain/source voltage $V_{DS}$ rises to a bus voltage $V_{BUS}$, which may be several thousand volts. The drain/source voltage $V_{DS}$ rises and falls as a function of the PWM signals. More specifically, when the PWM signals instruct transistor Q30 to turn off, the drain/source voltage $V_{DS}$ rises and when the PWM signals instruct transistor Q30 to turn on, the drain/source voltage $V_{DS}$ decreases. Turning the transistor off or on is sometimes referred to as changing its state. In other examples, the complement occurs based on signals decoded by the clamp control 540. A graph 602 is an exemplary timing diagram of the CLP1 signal as a function of time and a graph 604 is an exemplary timing diagram of the CLP2 signal as a function of time. As shown in graph 602, the CLP1 signal is low during the period that the drain/source voltage $V_{DS}$ is high. This low signal opens switch SW57 to generate the voltage $V_{DS\_SN}$ as described below. The CLP2 signal is low during the period when the drain/source voltage $V_{DS}$ is low, which opens switch SW58 and enables the generation of the voltage $V_{ON\_SNS}$ as described below.

During periods when the drain/source voltage $V_{DS}$ is high enough such that sensing cannot be accomplished on the output 406, the CLP1 signal is low and the CLP2 signal is high, which means the switch SW57 is open and switch SW58 is closed. The drain/source voltage $V_{DS}$ is then divided between capacitor C50 and the capacitors in the capacitive array 508 that are coupled to node N50. The voltage on node N50 is the voltage $V_{DS\_SNS}$. Graph 610 is an exemplary timing diagram of the voltage $V_{DS}$ SNS over a period of three cycles of the drain/source voltage $V_{DS}$ as shown in graph 600. In a first iteration or a first cycle shown by graph 612, several capacitors in the capacitive array 508 are coupled to node N50, so the voltage $V_{DS\_SNS}$ is relatively low. More specifically, the voltage $V_{DS\_SNS}$ is less than the reference voltage $V_{REF}$. This voltage difference is measured by the comparator 516, which outputs a signal to the calibration circuit 510 indicating that the voltage $V_{DS\_SNS}$ is less than the reference voltage $V_R$. In response to the signal from the comparator 516, the calibration circuit 510 opens at least one switch in the capacitive array 508 to decouple at least one capacitor in parallel from node N50. During a second iteration when the drain/source voltage $V_{DS}$ goes high, the reduction in capacitance in the capacitive array 508 increases the voltage $V_{DS\_SNS}$ as shown by graph 614. The comparator 516 generates another signal indicating that the voltage $V_{DS\_SNS}$ is still less than the reference voltage $V_{REF}$, so the calibration circuit 510 decouples another capacitor from node N50.

During a third iteration of the drain/source voltage $V_{DS}$, the calibration circuit 510 has coupled less capacitance to node N50. During this third iteration shown by the graph 616, the voltage $V_{DS\_SNS}$ is equal to the reference voltage $V_{REF}$ or is within a predetermined amount of the reference voltage $V_{REF}$. The calibration circuit 510 or a component associated therewith calculates the drain/source voltage $V_{DS}$ based on the value of the capacitance in the capacitive array 508 coupled to node N50. By knowing the value of $V_{DS\_SNS}$, which is $V_{REF}$, the value of capacitor C50, and the value of the capacitance in the capacitive array 508 coupled to node N50, the drain/source voltage $V_{DS}$ is readily calculated, such as with Kirchoff's current law. The drain/source voltage $V_{DS}$ is used by the circuitry 300, FIG. 4, for many purposes, including feedback to control the voltage across transistor Q30. This iterative process may continue during operation of the circuit 400. In other examples, the sensed voltage $V_{DS\_SNS}$ is measured directly and the number of capacitors required to meet the reference voltage is coupled to node N50.

The drain/source voltage $V_{DS}$ typically does not settle to zero between pulses, but rather stays at some voltage or fluctuates slightly. The current sensing portion 502, FIG. 5, of the circuitry 400 measures the drain/source voltage $V_{DS}$ when transistor Q30 is on and produces the voltage $V_{ON\_SNS}$. Transistor Q30 has very little resistance when it is on, so the drain/source voltage $V_{DS}$ should be very low, even when it is passing high current. If transistor Q30 is operating into a short or into a load that pulls excessive current, the drain/source voltage $V_{DS}$ will be high, or higher than a predetermined low voltage value, when transistor Q30 is on. The high drain/source voltage $V_{DS}$ is reflected as a high voltage $V_{ON\_SNS}$, which is processed by the controller 422, FIG. 4, and/or other components. The controller 422 may cause predetermined actions in response to a high drain/source voltage $V_{ON\_SNS}$, such as turning transistor Q30 off by way of the modular/adaptive power stage 420. The circuitry 400 is able to detect the overload or short situation in a single pulse of the drain/source voltage $V_{DS}$. Conventional gate drivers and other devices for detecting shorts and overloads take much longer, which may damage devices and components.

Figure 7:
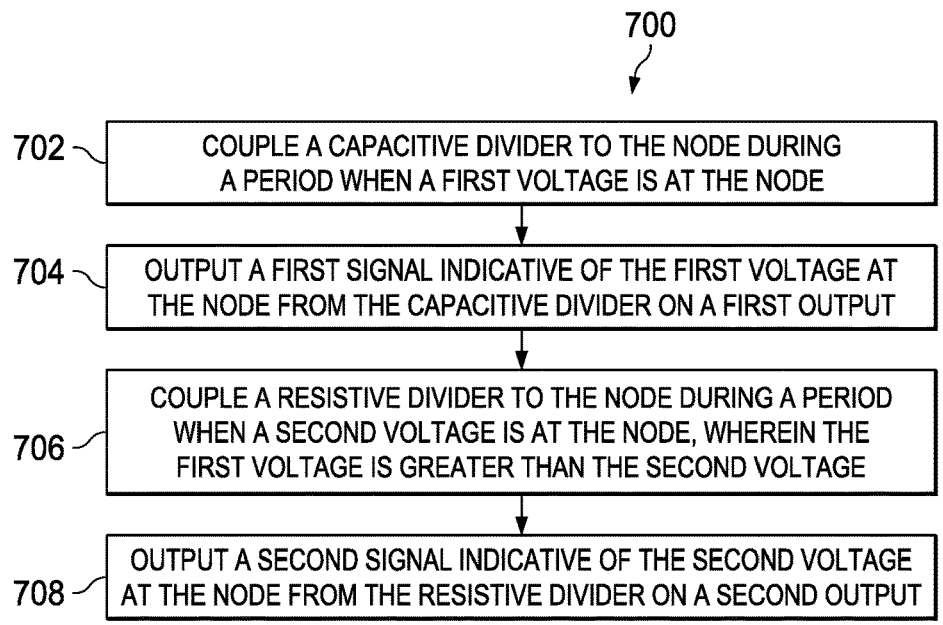
FIG. 7 is a flowchart describing the operation of the gate driver of FIG. 4.

FIG. 7 is a flowchart 700 describing the operation of the gate driver 300 of FIG. 4. The method is related to determining the voltage at a node, such as the drain of a transistor. Step 702 of the flowchart 700 includes coupling a capacitive divider to the node during a period when a first voltage is at the node. Step 704 includes outputting a first signal indicative of the first voltage at the node from the capacitive divider on a first output. Step 706 includes coupling a resistive divider to the node during a period when a second voltage is at the node, wherein the first voltage is greater than the second voltage. Step 708 includes outputting a second signal indicative of the second voltage at the node from the resistive divider on a second output.

The gate circuitry 400 of FIG. 4 has been described as being a part of the gate driver 300 and operating with other components in the gate driver 300. In some embodiments, the circuitry 400 operates independent of the gate driver 300 and/or with other gate driver configurations. For example, the circuitry 400 may drive the complementary switch in a half-bridge converter.

Figure 8:
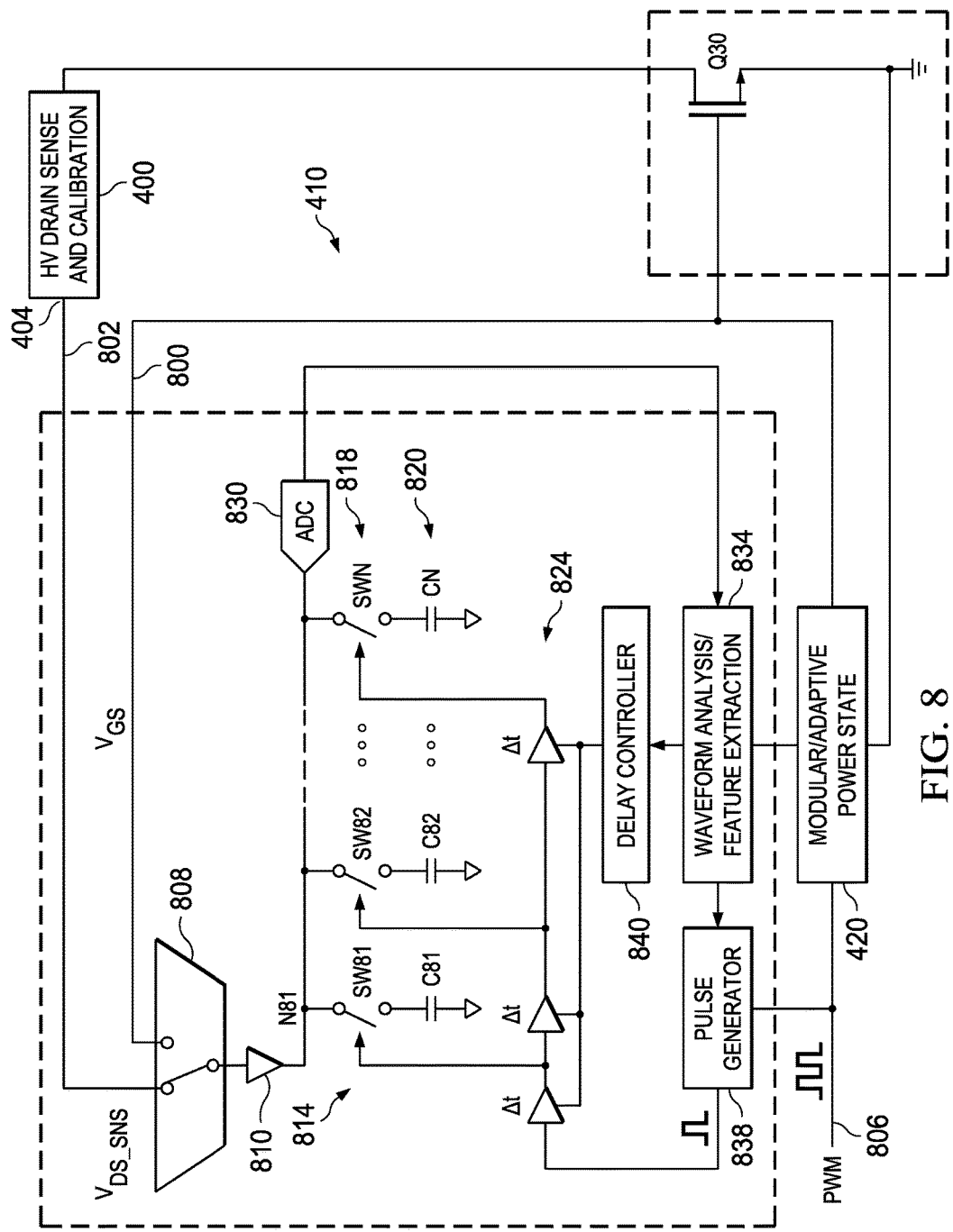
FIG. 8 is a block diagram of an example of the timing extraction and delay generation circuitry of FIG. 4.

FIG. 8 is a block diagram of an example of the timing extraction and delay generation circuitry 410 of FIG. 4. The circuitry 410 is being described herein as operating in conjunction with the other components of the gate driver 300 of FIG. 4. However, the circuitry 410 may operate independent of these components or in conjunction with other gate drivers. The circuitry 410 serves a plurality of functions including detecting the start and end of each turn-on and turn-off stage when the drain/source voltage $V_{DS}$ rises and falls. This detection enables evaluation or capturing of the dv/dt and di/dt durations, which are the rises and falls of the drain/source voltage $V_{DS}$ and the drain current $I_D$. When the drain/source voltage $V_{DS}$ is analyzed, over-current events can also be analyzed and corrected. The circuitry 410 may detect zero voltage switching (ZVS) conditions on transistor Q30, which may be detected before transistor Q30 turns on. ZVS occurs when the voltage of the drain is already low when the gate input is requesting turn-on. In this case, the dv/dt and di/dt sensing cannot be achieved and the control of the gate can be changed to accommodate this different mode of operation. Typically the gate can then be turned on faster without the limitations of the adaptive controller.

The circuitry 410 includes a first input 800 that is coupled to the gate of transistor Q30. The voltage at the input 800 is the gate voltage $V_{GS}$ of transistor Q30, which may be the voltage at node N31, FIG. 3. A second input 802 is coupled to the output 404 of FIG. 4 and is the sensed drain voltage $V_{DS\_SNS}$, which is proportional to the transitions in the drain/source voltage $V_{DS}$. In embodiments using other components, the second input 802 may be coupled to another component that generates a drain/source voltage or other voltage applicable for use by the circuitry 410. A third input 806 receives the PWM signal described above. The first input 800 and the second input 802 are coupled to inputs of a multiplexrr (MUX) 808. The output of the multiplexor 808 is coupled to a driver 810, which is not included in all examples of the circuitry 410. The output of the driver 810 is coupled to sample and hold circuitry 814 at a node N81. Some examples of the circuitry 410 do not include the MUX 808, but rather have two sample and hold circuits, with one coupled to the first input 800 and one coupled to the second input 802.

The sample and hold circuitry 814 includes a plurality of switches 818 that selectively couple a plurality of capacitors 820 to node N81. A first switch SW81 couples a first capacitor C81 to node N81, a second switch SW82 couples a second capacitor C82 to node N81, and an Nth switch SWN couples a Nth capacitor CN to node N81. The states of the switches 818 are controlled by a plurality of delays 824 as described herein. The switches open and close at different times to capture either the voltage $V_{DS\_DNS}$ or the gate voltage $V_{GS}$ that is present at node N81 depending on which signal is being passed by the MUX 808. Node N81 is coupled to the input of an analog-to-digital converter (ADC) 830 that selectively converts the voltages stored on the capacitors 820 to digital signals.

A waveform analysis and feature extraction unit 834 (sometimes referred to as the analysis circuitry) processes the digital signal generated by the ADC 830 and controls the drive on transistor Q30 by way of the modular/adaptive power stage 420 as described herein. The functions of the unit 834 may be implemented by way of software, hardware, or firmware. The unit 834 generates signals to control a pulse generator 838 and a delay controller 840. The delay controller 840 selectively activates the switches 818 so that one at a time is closed depending on the sensed drain voltage $V_{DS\_SNS}$ or the gate voltage $V_{GS}$. The pulse generator 838 generates sampling pulses to set the sampling period that each of the capacitors 820 samples. The pulse generator 838 generates a plurality of sampling pulses during the rise and fall period of the sensed drain voltage $V_{DS\_SNS}$ and the gate voltage $V_{GS}$.

The circuitry 410 receives the sensed drain voltage $V_{DS\_SNS}$ and the gate voltage $V_{GS}$ at the input of the MUX 808. A signal, such as a signal generated by the unit 834 instructs the MUX 808 as to which of the two signals is to be passed by the MUX 808. The signal passed by the MUX 808 is amplified by the driver 810 and is present at node N81. The switches 818 are initially open, and close and open one at a time to sample the voltage at node N81 a total of N times, where N is the number of capacitors 820 in the sample and hold circuitry 814. In some examples, the sampling occurs every nanosecond over a period of N nanoseconds.

Figure 9:
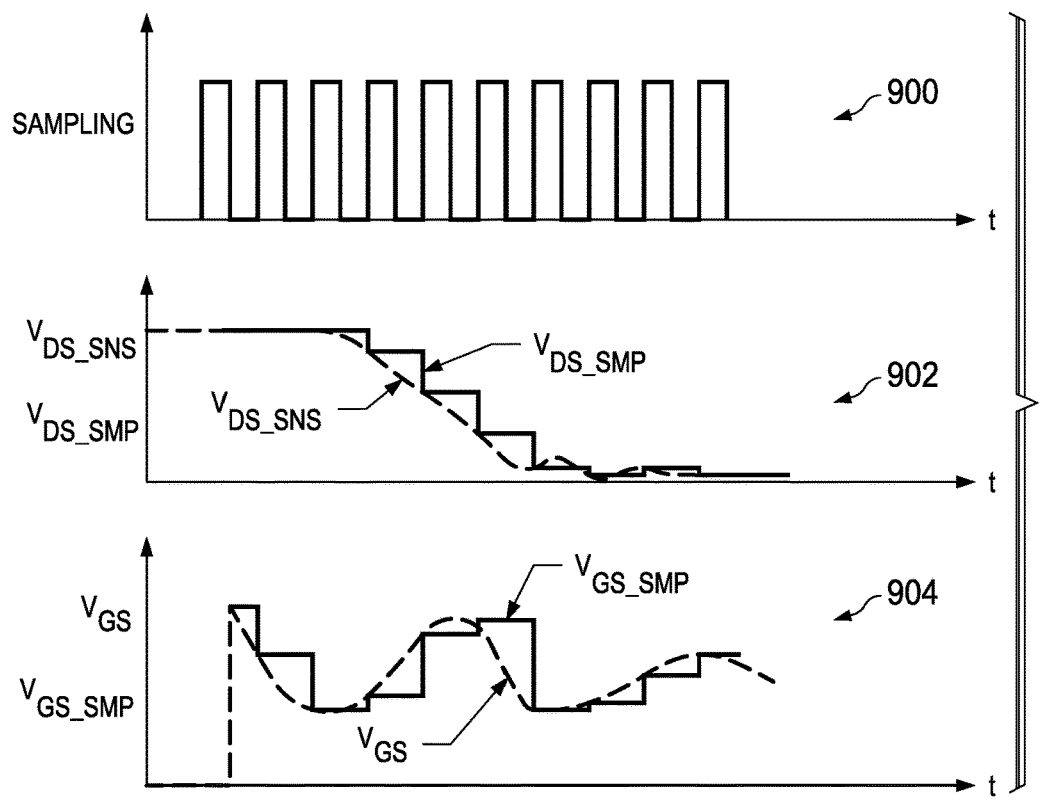
FIG. 9 is a plurality of graphs showing examples of a sampling timing diagram and a corresponding sensed drain voltage $V_{DS\_SNS}$ and gate voltage $V_{GS}$.

FIG. 9 is a plurality of graphs showing examples of the sampling pulses, the sensed drain voltage $V_{DS\_SNS}$ and the gate voltage $V_{GS}$. In addition, examples of the sampled sensed voltage $V_{DS\_SMP}$ and the sampled gate voltage $V_{GS\_SMP}$ are shown in the graphs of FIG. 9. A graph 900 shows an example of the sampling pulses generated by the pulse generator 838. The pulses must be generated at a frequency high enough to sample any necessary high frequency components of the sensed drain voltage $V_{DS\_SNS}$ and the gate voltage $V_{GS}$. In some embodiments, the sampling pulses have periods of about one nanosecond. By use of the delays 824, sub-nanosecond timing may be achieved without the use of a clock operating in the gigahertz range. A graph 902 shows an example of the sensed drain voltage $V_{DS\_SNS}$ as a dashed line. The sensed drain voltage $V_{DS\_SNS}$ is sampled by the sample and hold circuitry 814, resulting in the sampled drain voltage $V_{DS\_SMP}$ as shown in graph 902. A graph 904 shows an example of the gate voltage $V_{GS}$ as a dashed line and an example of the sampled gate voltage $V_{GS\_SMP}$. In some examples, the sensed drain voltage $V_{DS\_SNS}$ and the gate voltage $V_{GS}$ are sampled at different cycles, so only the single sample and hold circuitry 814 as shown in FIG. 8 is required. In other examples, one sample and hold circuit samples and holds the sensed drain voltage $V_{DS\_SNS}$ and another sample and hold circuit samples and holds the gate voltage $V_{GS}$.

The ADC 830 of FIG. 8 measures the voltages on the capacitors 820 shown by the graphs 902 and 904 and converts the analog voltages to digital signals, such as binary numbers. The digital signals are input to the unit 834 for processing. Because the sample and hold circuitry 814 samples the transitions in the sensed drain voltage $V_{DS\_SNS}$, the ADC 830, in some examples, performs the analog-to-digital conversion outside of the transition periods of the sensed drain voltage $V_{DS\_SNS}$.

Figure 10:
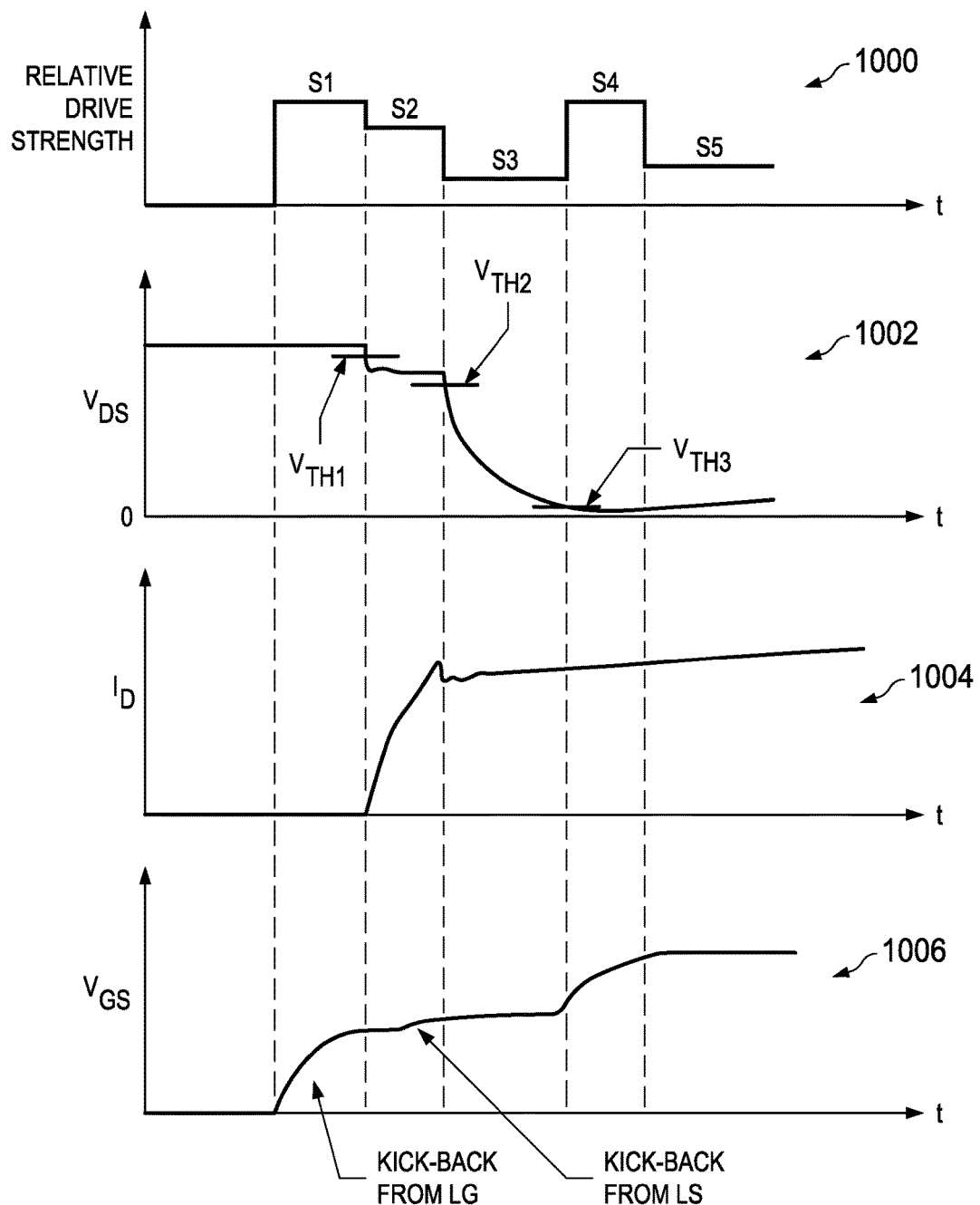
FIG. 10 is a plurality of graphs showing the five stages of the driving transistor that does not have a Kelvin sensor pin.

The unit 834 analyses the digital signals generated by the ADC 830 and generates instructions for the power stage 420, FIG. 4, which drives transistor Q30. The examples described herein control five stages of driving transistor Q30 as instructed by the unit 834. Reference is made to FIG. 10, which is a plurality of graphs showing the five exemplary stages of driving transistor Q30 wherein transistor Q30 does not have a Kelvin sensor pin. A first graph 1000 shows example relative drive strengths on transistor Q30 during the five drive stages, which are referred to as S1 through S5. A graph 1002 shows an example of the drain/source voltage $V_{DS}$ in response to the five drive stages S1 through S5. A graph 1004 shows the drain current $I_D$ during the five stages. A graph 1006 shows an example of the gate voltage $V_{GS}$ and the maximum gate voltage $V_{GS,MAX}$ during the five stages. The unit 834 or other components may set the periods of the stages S1 through S5.

During the first stage S1, the gate of transistor Q30 is driven hard by instructions from the unit 834, which turns transistor Q30 on as fast as possible. During the first stage S1, the drain/source voltage $V_{DS}$ has not fallen by an appreciable amount and the drain current $I_D$ has not risen by an appreciable amount. As shown in graph 1006, the gate voltage Vas has started to rise. During subsequent iterations, the strength of the drive of transistor Q30 may be modified to speed up or slow down the turn-on rate. During the second stage S2, the slope of the drain current $I_D$ (di/dt) is controlled. As shown by the graph 1004, the drain current $I_D$ rises fast, but is controlled so as not to exceed a predetermined di/dt limit. The drain/source voltage $V_{DS}$ is maintained within first and second thresholds $V_{TH1}$ and $V_{TH2}$ during the second stage S2. The third stage S3 focuses on controlling the slope of the drain voltage dv/dt. As shown by graph 1006, the gate voltage $V_{GS}$ rises slightly in this example and the drain current $I_D$ settles. The drain/source voltage $V_{DS}$ drops to a third threshold $V_{TH3}$ at the end of the third stage S3. The slope of the drain/source voltage dv/dt is maintained within predetermined limits during the third stage S3. The fourth stage S4 provides a fast overdrive so as to limit conduction losses. In this example, the gate voltage $V_{GS}$ has risen during the fourth stage S4. The fifth stage S5 maintains the drain current $I_D$, which is noted by holding the gate voltage $V_{GS}$ stable for the remaining time that transistor Q30 is on. The operation of the fifth stage S5 is dependent on feedback from the $V_{ON\_SNS}$ voltage at the output 406 of FIG. 4 and can be adjusted in response to the load current in a similar manner as described above.

By analyzing the digital data generated by the ADC 830, the unit 834, FIG. 8, is able to identify several parameters related to transistor Q30. In some examples, the unit 834 detects the start and stop of each of the above-described stages. For example, the di/dt (stage S2) and the dv/dt (stage S3) are determined in addition to the durations of the stages. More specifically, the transition times of di/dt and dv/dt are readily determined based on the analysis. Over-current events can be detected by monitoring the drain/source voltage $V_{DS}$ when transistor Q30 is on or turning on. If the drain/source voltage $V_{DS}$ is too high, there is too much current passing through transistor Q30. In a similar manner, voltage overshoot or undershoot is readily determined. The analysis further enables the unit 834 to adjust the timing and power of the drive signal applied to the gate of transistor Q30 during all the stages described above. A zero voltage switching (ZVS) condition is also determined before transistor Q30 is turned on in some applications. A ZVS condition occurs when the drain voltage is low and the gate input is requesting that the transistor turn on. In ZVS conditions, dv/dt and di/dt sensing cannot be achieved and the control of the gate can be changed to accommodate this different mode of operation. Typically, the transistor can be turned on faster without the limitations of an adaptive controller.

Figure 11:
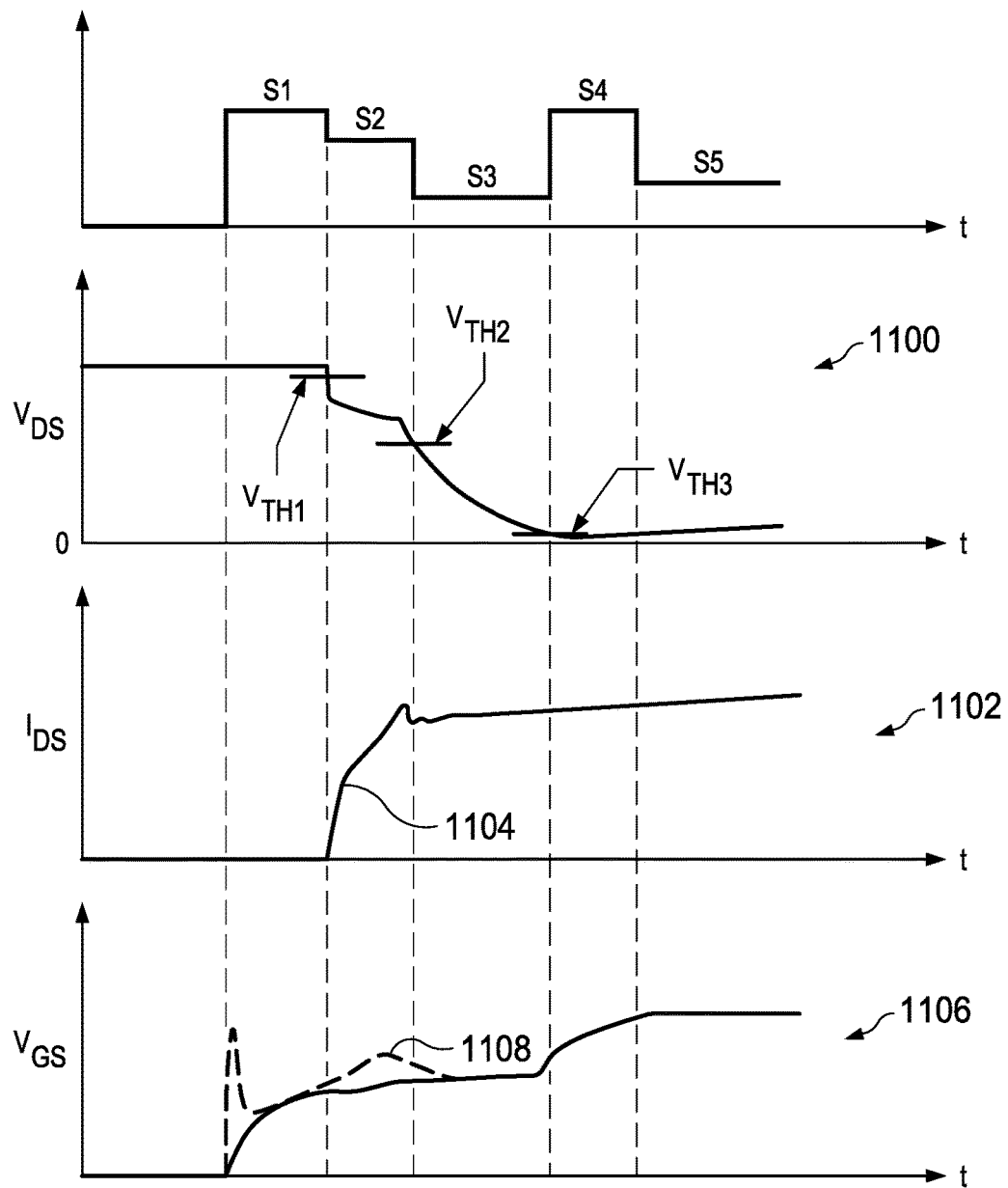
FIG. 11 is a plurality of graphs similar to the graphs of FIG. 10, but associated with a transistor having a Kelvin sensor contact.

FIG. 11 is a plurality of graphs similar to the graphs of FIG. 10, but associated with a transistor having a Kelvin source contact. The Kelvin source contact provides a low impedance contact to the source contact of transistor Q30. The parameters related to transistor Q30 differ slightly when transistor Q30 has a Kelvin source contact. A graph 1100 shows the drain/source voltage $V_{DS}$ of transistor Q30. As shown, the voltage difference between the first voltage threshold $V_{TH1}$ and the second voltage threshold $V_{TH2}$ is greater than examples where transistor Q30 does not include a Kelvin source contact. A graph 1102 shows the drain current $I_D$ flowing through transistor Q30. A portion 1104 of the graph 1102 shows a steeper di/dt, which is indicative of the Kelvin source. A graph 1106 shows the gate voltage $V_{GS}$ of transistor Q30. A portion 1108 shows a reduced kickback from the source inductance in transistor Q30. By analyzing the drain/source voltage $V_{DS}$, the drain current $I_D$, and the gate voltage $V_{GS}$, the unit 834 or other components can determine whether transistor Q30 has a Kelvin source contact.

In some examples, the pulse generator 838 can adjust the pulses to be longer or shorter to increase the resolution of the time base of the sampling in accordance with the speed of the device being switched. For example, a slow IGBT may need a longer time between samples than a SiC device, but will only have a fixed number of sample points to sample the show transition waveform.

Figure 12:
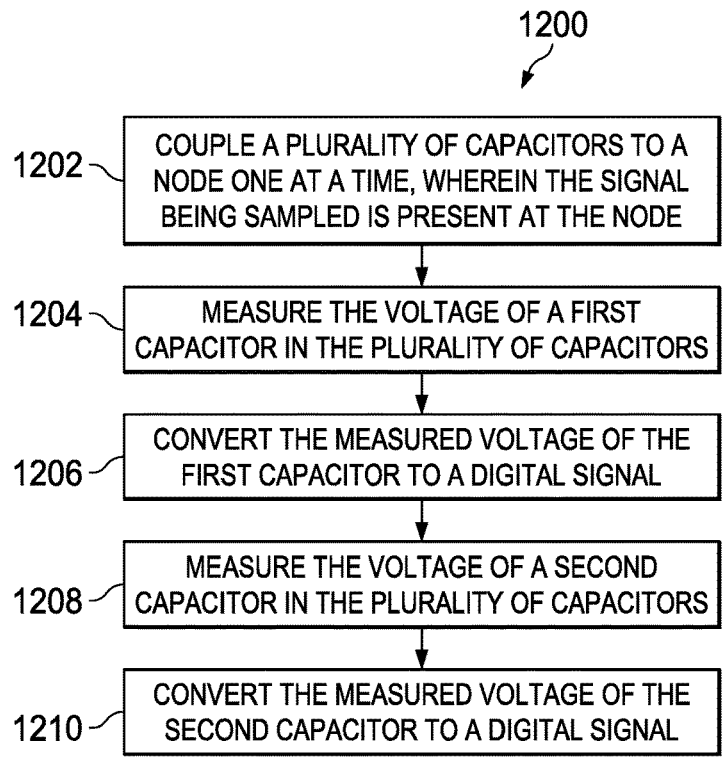
FIG. 12 is a flowchart describing an example of a method for converting the gate voltage $V_{GS}$ and the drain voltage $V_{DS}$ to digital signals.

FIG. 12 is a flowchart 1200 describing an example of a method for converting the gate voltage $V_{GS}$ and the drain/source voltage $V_{DS}$ to digital signals. It is noted that the circuits and methods may be applied to converting voltages other than drain/source and gate voltages to digital signals. Step 1202 of the flowchart 1200 includes coupling a plurality of capacitors to a node one at a time, wherein the signal being sampled is present at the node. Step 1204 includes measuring the voltage of a first capacitor in the plurality of capacitors. Step 1206 includes converting the measured voltage of the first capacitor to a digital signal. Step 1208 includes measuring the voltage of a second capacitor in the plurality of capacitors. Step 1210 includes converting the measured voltage of the second capacitor to a digital signal.

Figure 13:
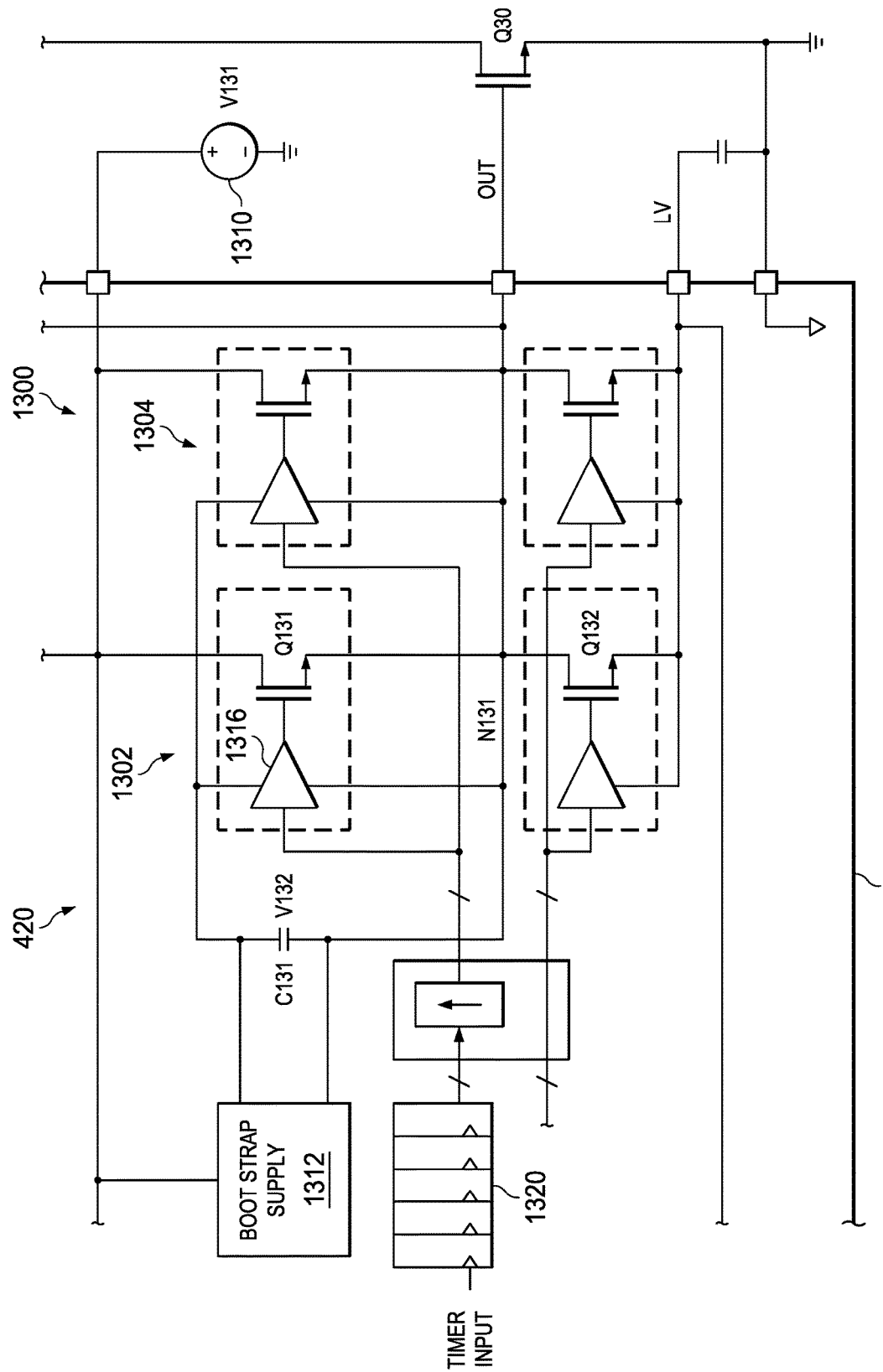
FIG. 13 is a block diagram of an example of the modular/adaptive power stage of FIG. 4.

FIG. 13 is a block diagram of an example of the modular/adaptive power stage 420 of FIG. 4. The power stage 420 may be used in gate drivers that differ from the gate driver 300 described in FIGS. 3 and 4. The power stage 420 includes a driver stage 1300 having a plurality of individual driver slices. In the example of FIG. 13, there are two driver slices, a first driver slice 1302 and a second driver slice 1304. The driver slices 1302 and 1304 sum current to drive the gate of transistor Q30 as described below. The driver slices 1302 and 1304 may be binary weighted, thermometer weighted, or weighted based on other factors. The conductors are illustrated in FIG. 13 as being single conductors. However, the conductors may be a plurality of parallel conductors, such as bus lines.

The first driver slice 1302 is similar to the second driver slice 1304 and other driver slices that may be included in the power stage 420. The following description of the first driver slice 1302 is applicable to all the aforementioned driver slices. The first driver slice 1302 includes a first transistor Q131 and a second transistor Q132 that are coupled in series at a node N131. The transistors Q131 and Q132 may be NMOS, PMOS, BJT or other transistors known to those skilled in the art. Node 131 is coupled to the gate of transistor Q30, so the voltage at node N131 is the gate voltage $V_{GS}$ of transistor Q30. Transistors Q131 and Q132 are coupled between a power supply 1310 and a ground node, wherein the power supply 1310 supplies a voltage V131. The ground node is at a potential that is different than the voltage V131 supplied by the power supply 1310. In some examples, the voltage V131 and the ground node may be varying supplies.

A power supply 1312 is coupled to the power supply 1310 and generates a voltage V132 in examples where the transistor Q131 is an NMOS pull-up implementation. In the example of FIG. 13, the power supply 1312 is a bootstrap supply. The output of the supply 1312 is coupled across a capacitor C131 and serves to supply power to a driver 1316 that drives the gate of transistor Q131. The power supply 1312 enables the gate of transistor Q131 to be driven at a different voltage than the voltage V131 supplied to the drain of transistor Q131. The input of the driver 1316 is coupled to a shift register 1320. The shift register 1320 stores the drive power in the different drive stages (S1-S5) for transistor Q30 as described above. The shift register 1320 outputs signals to turn on specific numbers of driver slices during different stages of the drive of transistor Q30. For example, if transistor Q30 is to be driven strong during one stage, several drive slices will be active during that stage. Likewise, if transistor Q30 is to be driven light during another stage, a few drive slices will be active during that stage.

Figure 14:
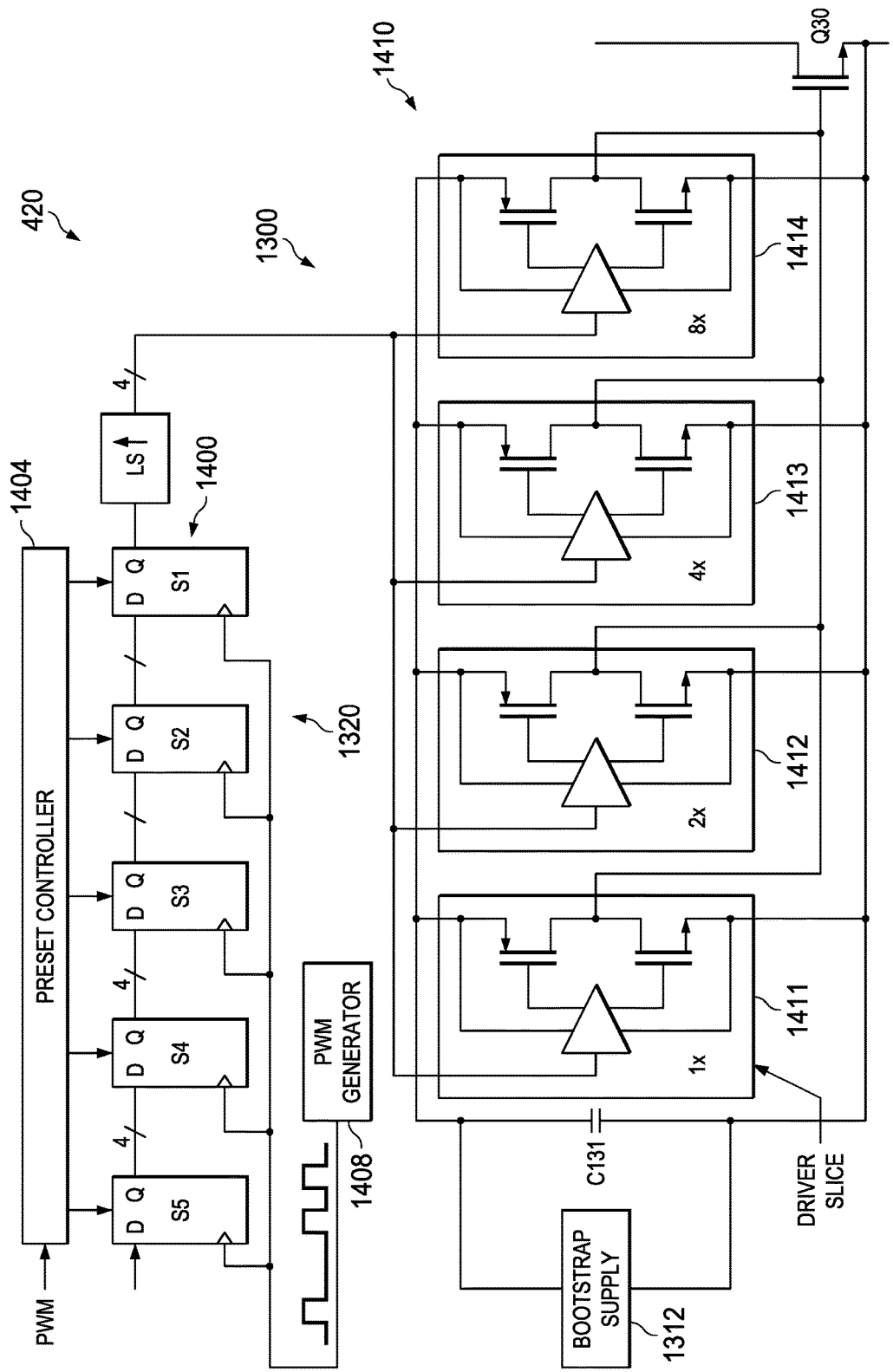
FIG. 14 is a detailed block diagram of an example modular/adaptive power stage of FIG. 13.

FIG. 14 is a partial detailed block diagram of an example implementation of the modular/adaptive power stage 420 of FIG. 13. The shift register 1320 in the example power stage 420 of FIG. 14 includes a plurality of D/Q flip-flops 1400, referenced individually as S1, S2, S3, S4, and S5, coupled in series. The individual flip-flops S1-S5 correlate to the five drive stages S1-S5 described above and may vary depending on the number of stages. The flip-flops 1400 have four channels or bits to pass from the input to the output, which enables a selection of sixteen discrete power levels driving transistor Q30 during each of the drive stages S1-S5. In other examples, the shift register 1320 has different numbers of channels to enable different numbers of discrete power levels driving transistor Q30. Each of the flip-flops 1400 shown in FIG. 14 may actually have one flip-flop per channel. For example, the flip-flop S1 may actually be four flip-flops, one per channel, functioning in unison.

The flip-flops 1400 are preset with the drive power corresponding to their respective stage in the drive cycle by a preset controller 1404. For example, if the first drive stage S1 is to drive transistor Q30 strong, a large number is preloaded into flip-flop S1. Numbers corresponding to the remaining drive stages S2-S5 are preloaded into their respective flip-flops. The flip-flops 1400 are driven by a PWM generator 1408. The pulse widths generated by the PWM generator correlate to the time each of the drive stages into transistor Q30 is to be active as described below.

The driver stage 1300 of FIG. 14 includes a plurality of driver slices as described with reference to FIG. 13. The drive stage 1300 includes four drive slices 1410, one for each channel. The drive slices 1410 are referenced individually as the first drive slice 1411, the second drive slice 1412, the third drive slice 1413, and the fourth drive slice 1414. The drive slices 1410 drive the gate of transistor Q30 at different drive levels. In the example of FIG. 14, the second drive slice 1412 drives twice as hard as the first drive slice 1411. The third drive slice 1413 drives twice as hard as the second drive slice 1412, and the fourth drive slice 1414 drives twice as hard as the third drive slice 1413. For example, the first driver slice 1411 may have a single transistor pair, the second drive slice 1412 may have two transistor pairs, the third drive slice 1413 may have four transistor pairs, and the fourth drive slice 1414 may have eight transistor pairs. Other drive configurations may be used and is determined by design choice.

The power stage 420 operates by receiving data regarding the drive power to transistor Q30 for each drive stage. In the example of FIG. 4, these drive stages are set by the timing extraction and delay generation 410, FIG. 4, and/or the dv/dt, di/dt, and overshoot control 416. These drive values are loaded into their corresponding flip-flops 1400. The power stage 420 also receives information as the amount of time each drive stage S1-S5 drives transistor Q30. During the first drive stage S1, the drive value of the first stage that was loaded into the first flip-flop S is output to the drive stage 1300. The drive value is a digital number wherein the least significant bit is coupled to the first drive slice 1411 and the most significant bit is coupled to the fourth drive slice 1414. This configuration enables larger drive values to turn on more transistors in the drive stage 1300, which drives transistor Q30 harder. The drive value into the drive stage 1300 remains for the period set by the PWM generator 1408 and as dictated by the drive time of the first drive stage. The timing is generated in the controller 422, FIG. 4, and/or the control 416 based on information extracted in the circuitry 410.

When the first drive stage has output to the drive stage 1300, the shift register 1320 shifts all the values stored in the shift register 1320. The drive value of the second drive stage is then stored in the first flip-flop S1. When the period for the first drive value has expired, the shift register 1320 shifts the second drive value to the drive stage 1300. The drive slices 1410 are activated per the second drive value as described above with reference to the first drive value. The process continues through all the drive stages S1-S5. When the last drive value is output to the drive slices 1410, another set of driver values is loaded into the shift register 1320 and the process continues. The values loaded into the shift register 1320 will typically change to converge the parameters of transistor Q30 to specific values.

The driver stage 1300 is controlled adaptively to turn on a specific number of driver slices 1410 at a given time, which enables variability in the drive strength and time. In some examples, the drive slices 1410 can function as resistors or as constant current sources. Thus, the drive strength can be either a varying current or a varying resistance (impedance).

In some embodiments, the voltage V131, FIG. 13, may be a controlled variable. Thus the voltage to switch the gates can be controlled in amplitude as well as time. Such embodiments enable a higher gate voltage during the di/dt portion of turn-on to improve switching speed in the presence of common source inductance and/or reduce gate voltage during turn-off in overload to reduce the drain current and minimize voltage overshoot. Generating the variable gate voltage may be achieved by using a higher external supply voltage and the variable supply is internally generated through a linear regulator or similar device. The trade-off with a fixed voltage driver is increased power loss in the driver in exchange for improved losses in the transistors in drive slices 1410 as well as improved control of the drive stage 1300 during fault conditions.

Figure 15:
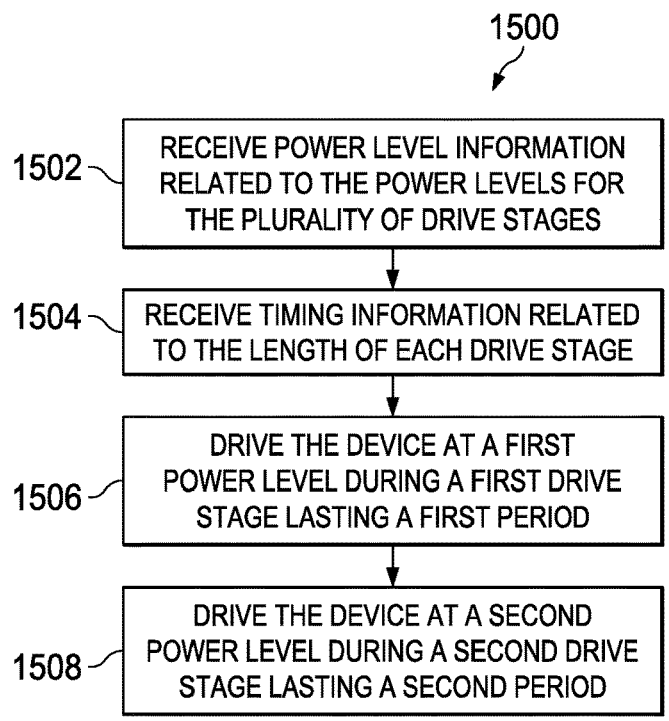
FIG. 15 is a flowchart describing an example of the operation of the power stage.

FIG. 15 is a flowchart 1500 describing an example of the operation of the power stage 420. More specifically, the flowchart 1550 describes a method for driving a device at different power levels during different drive stages of a drive cycle. Step 1502 of the flowchart 1500 includes receiving power level information related to the power levels for the plurality of drive stages. Step 1504 includes receiving timing information related to the length of each drive stage. Step 1506 includes driving the device at a first power level during a first drive stage lasting a first period. Step 1508 includes driving the device at a second power level during a second drive stage lasting a second period.

Although illustrative embodiments have been shown and described by way of example, a wide range of alternative embodiments is possible within the scope of the foregoing disclosure.

What is claimed is:

1. Circuitry comprising:
   timing circuitry configured to:
      detect transitions between drive stages during a first drive cycle; and
      adjust control information for the drive stages during a second drive cycle, based on the transitions between the drive stages of the first drive cycle, wherein the control information comprises first information for a first drive stage of the second drive cycle and second information for a second drive stage of the second drive cycle; and
   an adaptive power stage coupled to the timing circuitry, the adaptive power stage comprising:
      N drive slices coupled in parallel to an output, wherein N is an integer greater than 2;
      a shift register coupled to the drive slices, the shift register comprising a first flip-flop and a second flip-flop, the first flip-flop for storing the first information for the first drive stage during the second drive cycle and the second flip-flop for storing the second information for the second drive stage during the second drive cycle, the shift register for moving the second information for the second drive stage from the second flip-flop to the first flip-flop while shifting the shift register, wherein the first information is any of $2^N$ values; and
      control circuitry coupled to the shift register, to activate any of $2^N$ combinations of the N drive slices during corresponding drive stages during the second drive cycle, in response to shifting the shift register.

2. The circuitry of claim 1, wherein the output of the control circuitry couples to a gate of a transistor.

3. The circuitry of claim 1, wherein a drive slice of the drive slices comprises:
   a node coupled to a power supply; and
   a transistor coupled between the node and the output, a gate of the transistor coupled to the control circuitry.

4. The circuitry of claim 1, wherein the control circuitry varies drive power at the output.

5. The circuitry of claim 1, wherein a first drive slice of the drive slices outputs a first drive power and a second drive slice of the drive slices outputs a second drive power, wherein the first drive power is different from the second drive power.

6. The circuitry of claim 5, wherein the first drive slice outputs twice the drive power as the second drive slice.

7. The circuitry of claim 1, wherein the circuitry has an input for receiving information indicating durations for the first drive stage and for the second drive stage.

8. The circuitry of claim 7, wherein shifting the shift register is performed in response to receiving a pulse width modulated signal.

9. The circuitry of claim 1, wherein the first flip-flop of the shift register stores a first number corresponding to a first drive power to be output during the first drive stage and the second flip-flop of the shift register stores a second number corresponding to a second drive power to be output during the second drive stage.

10. A method comprising:
    detecting, by timing circuitry, transitions between drive stages during a first drive cycle;
    adjusting, by the timing circuitry, control information for the drive stages during a second drive cycle, based on the transitions between the drive stages during the first drive cycle, wherein the control information comprises first information for a first drive stage during the second drive cycle and second information for a second drive stage during the second drive cycle;
    receiving, by a power stage from the timing circuitry, the first information indicating a first power level for the first drive stage during the second drive cycle;
    storing the first information in a first flip-flop of a shift register, wherein the first information is any of $2^N$ values, wherein N is an integer greater than two;
    receiving, by the power stage from the timing circuitry, the second information indicating a second power level for the second drive stage during the second drive cycle, after receiving the first information;
    storing the second information in a second flip-flop of the shift register;
    shifting the shift register, the shifting comprising:
       reading the first information from the first flip-flop; and
       moving the second information from the second flip-flop to the first flip-flop;
    driving, by the power stage, a device at the first power level during the first drive stage, in response to reading the first information from the first flip-flop; and
    driving, by the power stage, the device at the second power level during the second drive stage, in response to reading the second information from the first flip-flop.

11. The method of claim 10, further comprising:
    converting the first information for the first drive stage to a first number, the first number corresponding to a first combination of parallel drive slices activated during the first drive stage of the second drive cycle; and
    converting the second information for the second drive stage to a second number, the second number corresponding to a second combination of parallel drive slices activated during the second drive stage of the second drive cycle, and wherein the parallel drive slices are coupled to the device.

12. The method of claim 11, wherein the parallel drive slices include a first drive slice and a second drive slice, wherein the second drive slice outputs twice the drive power as the first drive slice.

13. The method of claim 10, wherein the device is a transistor, and wherein driving the device comprises driving a gate of the transistor.

14. The method of claim 10, wherein the first information further indicates a first duration of the first drive stage of the second drive cycle and the second information further indicates a second duration of the second drive stage of the second drive cycle, wherein driving the device at the first power level lasts for the first duration, and wherein driving the device at the second power level lasts for the second duration.

15. The method of claim 14, wherein shifting the shift register is performed in response to the first duration expiring.

16. Timing circuitry comprising:

a sample and hold circuit coupled to a transistor, the sample and hold circuit configured to sample and hold:
a gate voltage of the transistor, to generate a sampled gate voltage; and
a sensed drain voltage of the transistor, to generate a sampled sensed drain voltage; and
analysis circuitry coupled to the sample and hold circuit, the analysis circuitry configured to:
detect transitions between drive stages during a first drive cycle, based on the sampled gate voltage and the sampled sensed drain voltage; and
adjust control information for the drive stages during a second drive cycle, based on the transitions between the drive stages of the first drive cycle, wherein the control information comprises first information for a first drive stage of the second drive cycle and second information for a second drive stage of the second drive cycle.

17. The timing circuitry of claim 16, wherein the analysis circuitry is further configured to detect zero voltage switching conditions on the transistor.

18. The timing circuitry of claim 16, wherein the sample and hold circuitry comprises:

a node;
a first capacitor;
a first switch coupled between the node and the first capacitor;
a second capacitor; and
a second switch coupled between the node and the second capacitor.

19. The timing circuitry of claim 18, further comprising:
a delay controller coupled to the sample and hold circuitry and to the analysis circuitry, the delay controller configured to selectively activate the first switch and the second switch based on the transitions between the drive stages; and
a pulse generator coupled to the timing circuitry and to the sample and hold circuit, the pulse generator configured to generate sampling pulses for the sample and hold current based on the transitions between the drive stages.

20. The timing circuitry of claim 16, further comprising a multiplexer coupled to the sample and hold circuit, the multiplexer configured to select either the gate voltage of the transistor or the sensed drain voltage of the transistor.

* * * * *